United States Patent [19]
Delagebeaudeuf et al.

[11] 3,992,715
[45] Nov. 16, 1976

[54] LOW-NOISE THERMO-IONIC INJECTION DIODE

[75] Inventors: Daniel Delagebeaudeuf; Didier Meignant, both of Paris, France

[73] Assignee: Thomson-CSF, Paris, France

[22] Filed: Sept. 8, 1975

[21] Appl. No.: 611,551

[30] Foreign Application Priority Data
Sept. 10, 1974 France............... 74-30621

[52] U.S. Cl.................. 357/13; 357/33; 357/57; 331/107 R
[51] Int. Cl.².......................... H01L 29/90
[58] Field of Search.......... 357/13, 33, 57; 331/107 R

[56] References Cited
UNITED STATES PATENTS

| | | | |
|---|---|---|---|
| 3,469,117 | 9/1969 | Mizushima et al.......... | 357/13 |
| 3,668,555 | 6/1972 | Kasperkovitz............. | 357/57 |
| 3,824,490 | 7/1974 | Riley...................... | 331/107 R |

OTHER PUBLICATIONS

G. Wright, "'Punch-Through' Transit-Time Oscillator," Electronics Letters, vol. 4 No. 24, Nov. 29, 1968, pp. 543–544.

V. Sheorey et al., "Analy. of Punch–Through–Injection for a Transit–Time Neg. Res. Diode," Int. J. Electronics, vol. 30 No. 1, 1970, pp. 19–32.

S. Liu et al., "Low–Noise Punch–Through PN–VP, PNP, and P–N–Metal Microwave Diodes, "RCA Review, vol. 32, Dec., 1971, pp. 636–644.

J. Chu et al., "Microwave Oscillators in PNP Reach–Through Baritt Diodes," S–S Electronics, vol. 16, Jan. 1973, pp. 85–91.

Primary Examiner—Michael J. Lynch
Assistant Examiner—Joseph E. Clawson, Jr.
Attorney, Agent, or Firm—Oblon, Fisher, Spivak, McClelland and Maier

[57] ABSTRACT

A thermo-ionic diode with a very noise figure, using a special semiconductor structure, is provided. The structure comprises, upon a P⁺ doped silicon substrate, a succession of N-doped layers whose thicknesses and impurity ratios are designed to optimize the noise figure, a final P⁺ type layer covering the structure. The injecting junction of the diode is located at the transition between the said P⁺ layer and the nearest N type layer having a weak doping.

5 Claims, 2 Drawing Figures

LOW-NOISE THERMO-IONIC INJECTION DIODE

The present invention relates to a special semiconductor structure for a thermo-ionic injection diode, capable of operation as a very high frequency amplifier with a very low noise figure. The object of the invention is to make it possible to amplify signals, in particular low-amplitude signals, with a noise figure which is lower than the values hitherto obtained when using injection-type diodes.

Those skilled in the art will be aware that it is difficult to obtain a noise figure below 10 db using injection diodes. In the case of reflex amplifiers utilising "BARITT" type thermo-ionic injection diodes, currently noise figures of the order of 15 db are obtained. The result is even more unfavourable if "GUNN" diodes are used. As far as amplifiers incorporating tunnel diodes, are concerned, these must be eliminated for other reasons, arising in particular from the difficulties encountered in operating them and in particular the limit on their effective power.

The object of the present invention is to achieve a noise figure substantially less than 10 db in the context of very high frequency amplification, in particular X-band operation.

In accordance with the invention, there is provided a thermo-ionic injection diode destined to operate at a predetermined frequency, comprising between two extreme layers of a semiconductor material doped to produce a first conductivity type, the doping impurity ratio being high enough to allow said layers to play the role of electrodes:

a first layer of a semiconductor material doped to a lesser extent than said extreme layers in order to produce the opposite conductivity type, the thickness of said layer being very low in comparison to the thickness producing a transit angle close to $3\pi/2$ at said frequency;

a second and a third layer of the same semiconductor as said first layer, doped to a lesser extent than the extreme layers in order to produce the opposite conductivity type, the doping impurity ratio of the second layer being higher than that of said first and third layers, the total thickness of said second and third layers producing a transit angle close to $3\pi/2$ at said frequency.

The invention will be better understood and other of its features rendered apparent from a consideration of the ensuing description and the related drawings in which.

In order to explain the principle of the invention, in the following some theoretical data concerning the operation of thermo-ionic injection diodes will be recapitulated.

The commonest structures encountered in thermo-ionic injection diodes, are the PNP type. They are consequently similar to the transistor, although it should be pointed out that in this case the base electrode is absent. They operate in the punch-through condition, that is to say that the bias voltage is sufficient to contrive that the space charge zone associated with the reverse-biased junction, extends throughout the end layer and reaches the other junction. The corresponding voltage is referred to as the punch-through voltage and defines the conduction and non-conduction states. In other words, for an applied voltage in excess of the punch-through voltage, there is a reduction in the potential barrier which has to be cleared by the holes from the injecting P-zone. These holes, therefore penetrate into the end layer and pass through the same at a velocity which approaches closer to the limiting velocity, the stronger the mean static electric field there.

In sinusoidal operation, the charge carrier current at the injection plane (defined in position, working from the injection junction, by the thickness of the potential barrier), is in phase with the alternating field in this plane and the injected charge carriers therefore pass into the space charge zone occupying the whole of the N layer. A simple piece of reasoning shows that a negative resistance condition will exist if the transit angle is close to $3\pi/2$.

As far as the noise factor is concerned, it can be shown that the thickness of the potential barrier plays an important part as also does the law of variation and velocity as a function of the trajectory followed through the transit zone. In a simple PNP structure, the only important parameter is the doping level of the central layer and, under these circumstances, calculation showns that the noise figure has a minimum value of the order of 10db. By contrast, in a structure with several N type layers, supplementary parameters are introduced. Optimising is desirable, leading to a lower noise figure.

The Applicant has carried out calculations upon a model which is capable of technological realisation, in particular a silicon model, and taking account of the various effects at work, in particular the effects associated with the mobile space charge. The calculations have made it possible to isolate the role played by each parameter in generating the noise. The thickness of the injection zone and the variation of velocity in the transit zone, depend upon different parameters and are particularly important from the point of view of the noise figure. The most favourable conditions are combined in the case of a structure with three N type layers, sandwiched between two semiconducting P+ (highly doped) layers or metal layers.

Figure 1:
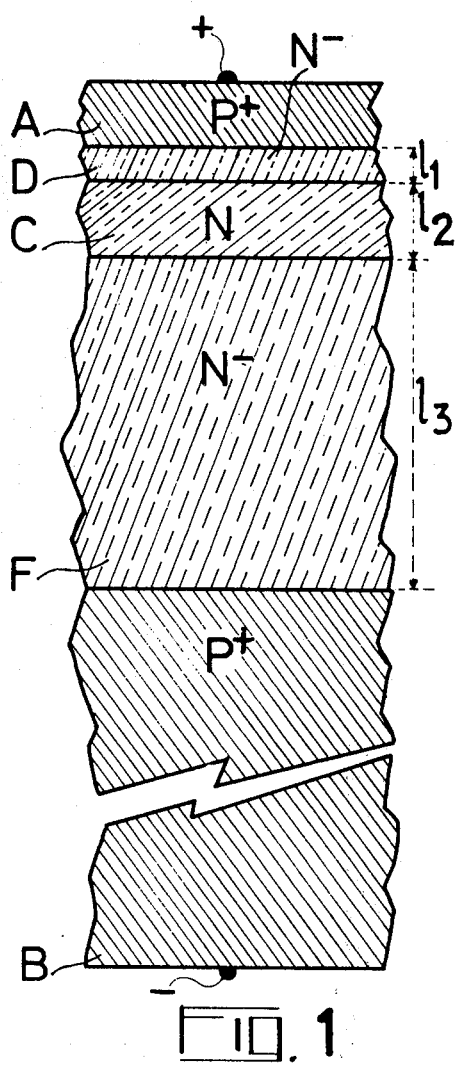
FIG. 1 illustrates, in section in a plane perpendicular to the layers of the structure, an embodiment of the invention.

FIG. 1 illustrates an example of a silicon structure in accordance with the invention designed for X-band operation. One of the extreme layers here takes the form of a substrate B made of silicon, having a P type doping impurity density of better than $10^{18}$ atoms per $cm^3$. On this substrate there have been deposited by successive epitaxial depositions of more or less highly doped silicon:

a layer F of thickness $l_3$ of the order of 6 to 7 microns: its N-type doping impurity density is of the order of $10^{14}$ at/$cm^3$;

a layer C of thickness $l_2$ of the order of 1 micron; its N-type doping impurity density is of the order of $6.10^{15}$ at/$cm^3$;

a layer D of thickness $l_1$ of the order of 0.35 microns; its N-type impurity density is in the order of 1 to $2.10^{14}$ at/$cm^3$;

a layer A whose thickness may range from 1 to several microns; its P type doping impurity density is of the same order as that of the substrate B.

The layer D is not strictly necessary and can be deleted, provided layer C be thicker. The total thickness (C + D) fixes the transit angle.

To be capable of being used as an electronic component, a structure of this kind must be finished in a manner known per se, this involving, for example, the metallising of a portion of the layer A (battery post +) and of the substrate B (battery post −), in order to form a base for the welding of the connections and possibly, the installation of the component in a casing.

Figure 2:
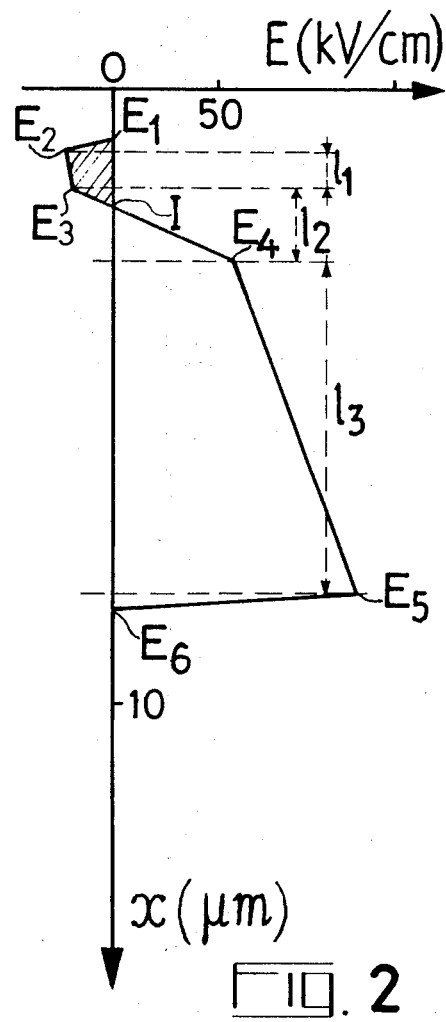
FIG. 2 illustrates the configuration of the static electric field developed in the structure in operation, considered perpendicularly to the layers.

FIG. 2 illustrates the theoretical configuration of the electric field in kilovolts per cm (plotted on the ordinates on an axis OE), when a positive direct voltage is applied between the layer A and the substrate B in order to direct bias the junction between the layers A and B. The abscissae axis Ox plots the spaces occupied on the perpendicular to the different layers, working from the layer A. The figurative graph of the field E, consists of a series of segments $E_1 E_2$, $E_2 E_3$, $E_3 E_4$, $E_4 E_5$ and $E_5 E_6$. $E_1 E_2$ and $E_5 E_6$ are roughly parallel to the axis OE; $E_2 E_3$ is roughly parallel to the axis Ox. The segment $E_3 E_4$ intersects the axis Ox at I; it has a steep slope whilst the segment $E_4 E_5$ has a flatter slope. The cross-hatched area defined by $E_1 E_2 E_3 I$ defines the so-called "injection" zone and corresponds to a barrier height of around 0.8 volts. The maximum field is in the order of 100 Kv/cm; the theoretical punch-through voltage is in the order of 85 volts.

The functions of the different layers in the operation of the structure, are the following. Injection takes place into the 0.35 micron layer D which is weakly doped in order to spread the potential barrier and accordingly contribute to a reduction in the noise figure. The layer C, of the order of 1 micron and more highly doped, enables the charge carriers to reach the limiting velocity, with a law of variation which promotes reduction in noise. Finally, layer F, having a thickness of 6 to 7 microns in the case of an X-band structure, prevents the ionisation phenomenon from occurring by limiting the field slope and therefore the maximum value of the field at the end of the structure.

The manufacture of the structure in accordance with the invention can be carried out, as described earlier, by successive epitaxial operations, commencing from a substrate. However, the formation of layers having thicknesses of less than 1 micron, is a delicate procedure and requires the deposition of a thicker layer which is subsequently ground down by known methods. It is also possible to produce the different layers by combining the processes of epitaxy and ion implantation.

The invention is applicable to the manufacture of electronic components designed for the amplification of microwaves, in particular in the X-band.

The structure can be utilised as a microwave generator.

What we claim:

1. A thermo-ionic injection diode destined to operate at a predetermined frequency, comprising between two extreme layers of a semiconductor material doped to produce a first conductivity type, the doping impurity ratio being high enough to allow said layers to play the role of electrodes:
   a first layer of a semiconductor material doped to a lesser extent than said extreme layers in order to produce the opposite conductivity type, the thickness of said layer being very low in comparison to the thickness producing a transit angle close to $3\pi/2$ at said frequency;
   a second and a third layer of the same semiconductor as said first layer, doped to a lesser extent than the extreme layers in order to produce the opposite conductivity type, the doping impurity ratio of the second layer being higher than that of said first and third layers, the total thickness of said second and third layers producing a transit angle close to $3\pi/2$ at said frequency.

2. A thermo-ionic injection diode as claimed in claim 1, wherein two $P^+$ type extreme layers encompass a $N^-$ type first layer, a N type second layer and a $N^-$ type third layer.

3. A thermo-ionic injection diode as claimed in claim 1, wherein two $N^+$ type extreme layers encompass a $P^-$ type first layer, a P type second layer and a $P^-$ type third layer.

4. A thermo-ionic injection diode as claimed in claim 1, wherein one of the extreme layers constitutes part of a semiconductor substrate of said diode.

5. A thermo-ionic injection diode as claimed in claim 2, wherein said predetermined frequency is included in the X band, the respective orders of magnitude of the thicknesses and N-doping ratios in the successive layers, being of 0.35 micron and $10^{14}$ to $2.10^{14}$ at/cm$^3$ in the case of the first layer, 1 micron and $6.10^{15}$ at/cm$^3$ in the case of the second layer, and 6 to 7 microns and $10^{14}$ at/cm$^3$ in the case of the third layer.

* * * * *